(12) United States Patent
Westra

(10) Patent No.: US 7,414,482 B2
(45) Date of Patent: Aug. 19, 2008

(54) RESONANCE MODE SELECTION USING A RESONATOR-SYNCHRONIZED SECOND-ORDER OSCILLATOR

(75) Inventor: Jan R. Westra, Uithoorn (NL)

(73) Assignee: Broadcom Corporation, Irvine, CA (US)

( * ) Notice: Subject to any disclaimer, the term of this patent is extended or adjusted under 35 U.S.C. 154(b) by 16 days.

(21) Appl. No.: 11/350,731

(22) Filed: Feb. 10, 2006

(65) Prior Publication Data

US 2007/0188247 A1    Aug. 16, 2007

(51) Int. Cl.
*H03B 5/12* (2006.01)

(52) U.S. Cl. .................... 331/36 C; 331/55; 331/135; 331/136

(58) Field of Classification Search ............. 331/55, 331/36 C, 135, 136
See application file for complete search history.

(56) References Cited

U.S. PATENT DOCUMENTS

| | | | |
|---|---|---|---|
| 4,988,900 A * | 1/1991 | Fensch | 327/337 |
| 6,377,646 B1 * | 4/2002 | Sha | 375/376 |
| 6,608,504 B2 * | 8/2003 | Fujimoto | 327/94 |
| 6,959,217 B2 * | 10/2005 | DelMain et al. | 607/60 |
| 2007/0024385 A1 * | 2/2007 | Greenberg | 331/158 |

* cited by examiner

*Primary Examiner*—Robert J. Pascal
*Assistant Examiner*—Levi Gannon
(74) *Attorney, Agent, or Firm*—Sterne, Kessler, Goldstein & Fox, PLLC

(57) ABSTRACT

A resonator-synchronized oscillator for resonance mode selection is disclosed. In one embodiment, the resonator-synchronized oscillator comprises an oscillation loop, at least one capacitor switching circuit coupled to the oscillation loop, and a multi-mode resonator having an output coupled to the at least one capacitor switching circuit. The output signal of the resonator is used to synchronize the oscillator using switched capacitor structures to instantaneously reset the phase of the resonator-synchronized oscillator.

22 Claims, 12 Drawing Sheets

RESONANCE MODE SELECTION USING A RESONATOR-SYNCHRONIZED SECOND-ORDER OSCILLATOR

CROSS REFERENCE TO RELATED APPLICATIONS

This application is related to co-pending patent application Ser. No. 11/350,755; filed Feb. 10, 2006, entitled "Quadrature Oscillator with Simplified Amplitude, Phase and Frequency Control" by Jan R. Westra, which application is incorporated by reference in its entirety herein.

FIELD OF THE INVENTION

The present invention relates generally to oscillators, and more specifically to oscillators using a resonator as the frequency selective element.

BACKGROUND OF THE INVENTION

In standard electronic systems, resonator oscillators are designed by using the known negative-impedance structure, such as is described for example, in the PhD thesis entitled 'Design of High-Performance Negative-Feedback Oscillators' by C. A. M. Boon and in the paper entitled 'Low-Noise Oscillators' published in 'Analog Circuit Design' by J. H. Huijsing et al., Kluwer Academic Publishers 1996. Selection of the desired resonance mode of a resonator is usually done using tuned circuits to enable discrimination of the different modes in the frequency domain.

Referring now to FIG. 1, there is shown an electrical model of two single resonance-mode resonators in the prior art. FIG. 1 depicts both a series and a parallel resonator, having a resonance frequency $\omega_0$:

$$\omega_{0,s} = \frac{1}{\sqrt{L_s C_s}}$$

$$\omega_{0,p} = \frac{1}{\sqrt{L_p C_p}}$$

for the series resonator, and for the parallel resonator.

In case of a series resonance the impedance is very low at resonance, while in the parallel resonator the impedance is very high at resonance. In both resonators, the impedance at resonance is purely resistive and given by:

$$Z(\omega_0)_{series} = R_s$$

$$Z(\omega_0)_{parallel} = Q_p^2 R_s$$

The quality factor $Q_p$ is given by:

$$Q_p = \omega_0 \frac{L_p}{R_s}$$

It is well known in the prior art that to construct an oscillator with this kind of resonator, the losses that are present in the resistive element have to be counteracted to sustain oscillation. This is typically accomplished by connecting the resonator to an amplifier that behaves like a negative resistance. This circuit will supply the energy that is lost during each cycle to sustain oscillation. Amplitude control of the oscillation can be performed by adjusting the value of the negative impedance circuit.

In multi-mode resonators, more than one parallel or series resonance modes is present, of which usually only one is the desired mode. A well known and often used example of the multi-mode resonator is the overtone crystal resonator. In a prior art crystal resonator, the first overtone, or fundamental is established when the crystal is resonating in its ground harmonic frequency. Although every crystal can be excited to resonate in an (odd) overtone like $3^{rd}$ $5^{th}$ or $7^{th}$ overtone, crystal manufacturers usually provide crystals that are specifically cut for this purpose.

Overtone crystal oscillators usually use a crystal specifically intended to be used as an overtone resonator, together with the negative impedance circuit and an extra frequency selective (tuned) circuit to select the desired overtone as shown in FIG. 2.

Other examples of multi-mode resonators include micro-machined structures that are specifically intended for this purpose, like micro-machined accellerometers.

In U.S. Pat. No. 6,225,872 a method of selecting a desired resonance mode in the time domain is introduced, using a synchronized first-order, or relaxation oscillator as the time-selective element. The prior art patent describes how a first-order, or relaxation oscillator can be used to select a resonance mode in a resonator using selectivity in the time domain. It is described how the square wave output of a first-order oscillator, oscillating at frequency $\omega_1$ is fed into a multi-mode resonator as shown in FIG. 3. When the frequency $\omega_1$ is close to the desired resonance at frequency $\omega_0$ of the multi-mode resonator, the desired resonance will be excited. The sine-wave at the output of the multi-mode resonator can be used to synchronize the first-order oscillator, enabling sustained oscillation at coo.

Referring now to FIG. 4, there is shown how reference levels $E_l$ and $E_h$ in the prior art circuit are modulated with the amplified output of the multi-mode resonator in order to make the first-order oscillator lock to the desired resonance mode of the multi-mode resonator. When the oscillator is locked, the first-order oscillation is in complete lock with the desired resonance mode, as shown in FIG. 5.

There are several disadvantages with this prior art oscillator. One problem of the first-order oscillator of the prior art is that it always excites the multi-mode resonator with a square or sawtooth shaped waveform. However, when high spectral purity is required, it is advantageous for the multi-mode resonator to be excited by a sine wave. To enable locking, a required feature of an oscillator implementing the timing reference is the ability to perform an instantaneous phase reset when synchronized to an external signal. Therefore, in oscillators having a high spectral purity from a multi-mode resonator, without the need for (external) tuning circuits, the need exists for a system in which an oscillator is implemented using a sine-wave oscillator with resettable phase.

BRIEF SUMMARY OF THE INVENTION

The present invention comprises a system and method, such as a resonator circuit, substantially as shown in and/or described in connection with at least one of the figures, as set forth more completely in the claims.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known processes and steps have not been described in detail in order not to unnecessarily obscure the present invention.

The invention generally pertains to a second order oscillator synchronized to a resonator. While the free-running frequency of the second-order oscillator is close in frequency to the desired mode of the (multi-mode) resonator or a subharmonic thereof, the second-order oscillator forces the (multi-mode) resonator to start in the desired mode of oscillation. Vice versa, the output signal of the resonator is used to synchronize the second order oscillator, using switched capacitor structures to instantaneously reset the phase of the second order oscillator.

Figure 1:
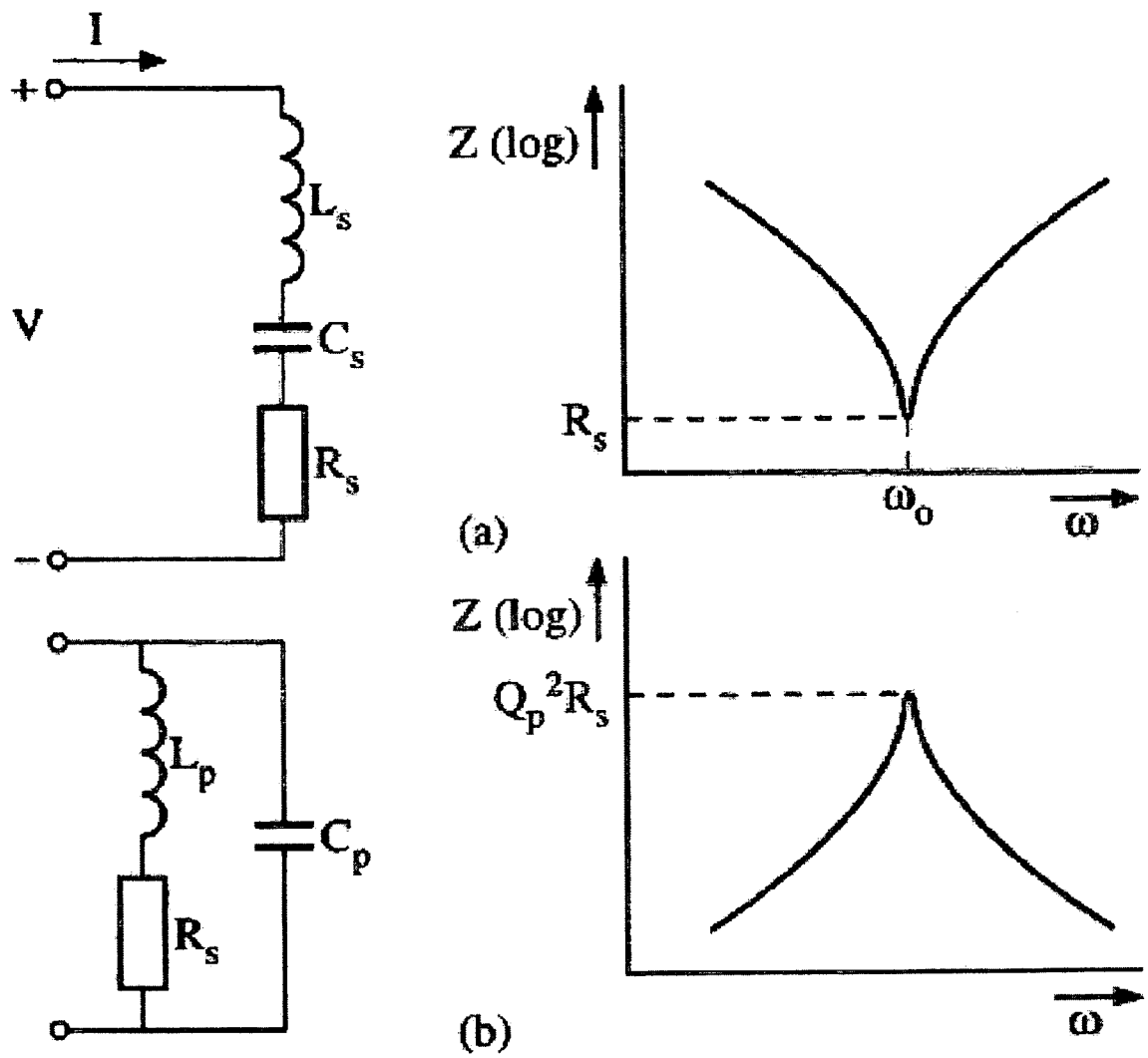
FIG. 1 illustrates an electrical model of two single resonance-mode resonators in the prior art.
Figure 2:
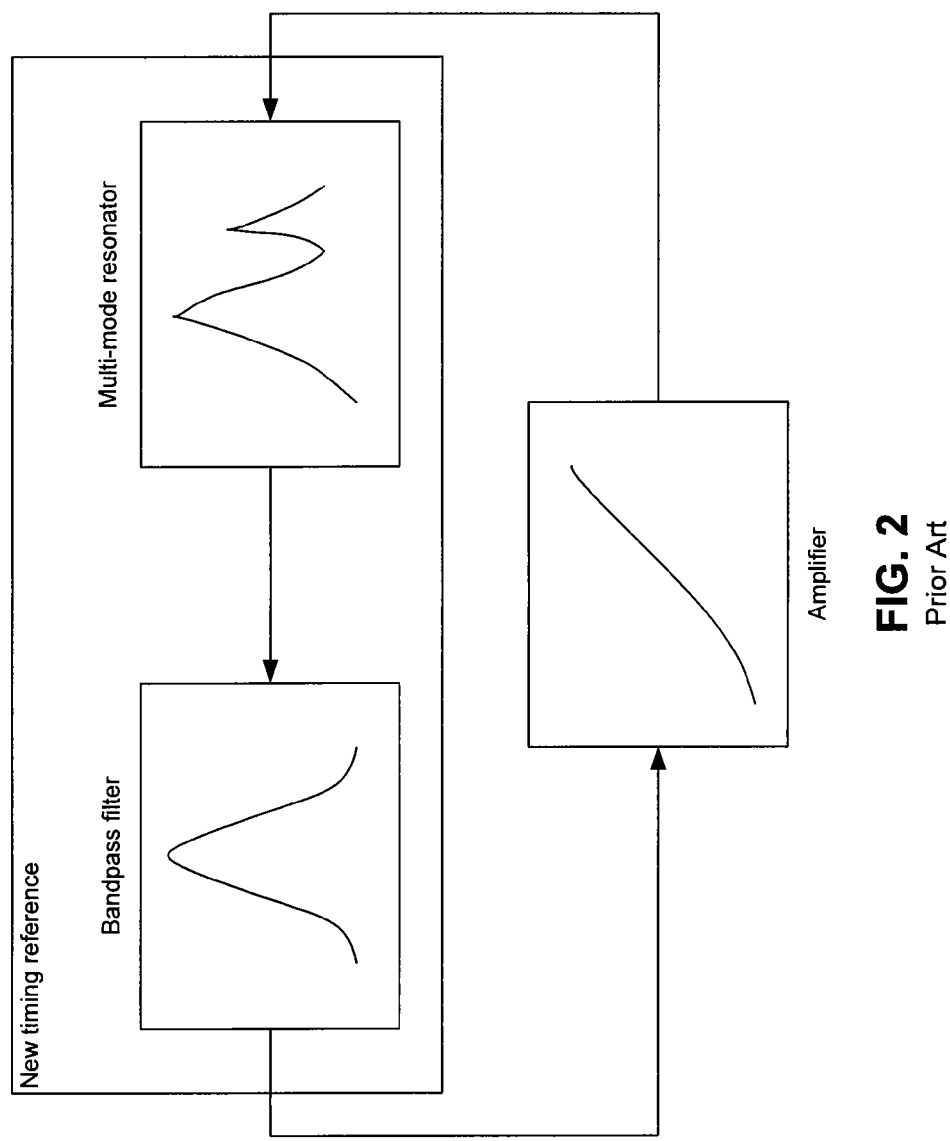
FIG. 2 illustrates a prior art multi-mode resonator with amplifier and bandpass filter for resonance mode selection.
Figure 3:
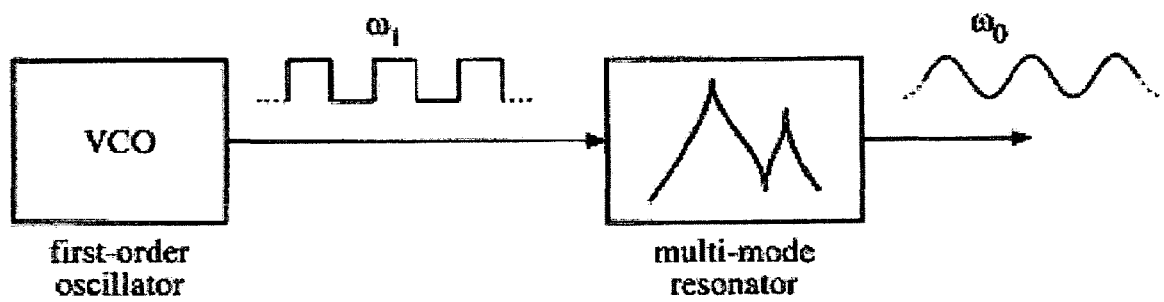
FIG. 3 illustrates a prior art multi-mode resonator excited by a first order oscillator.
Figure 4:
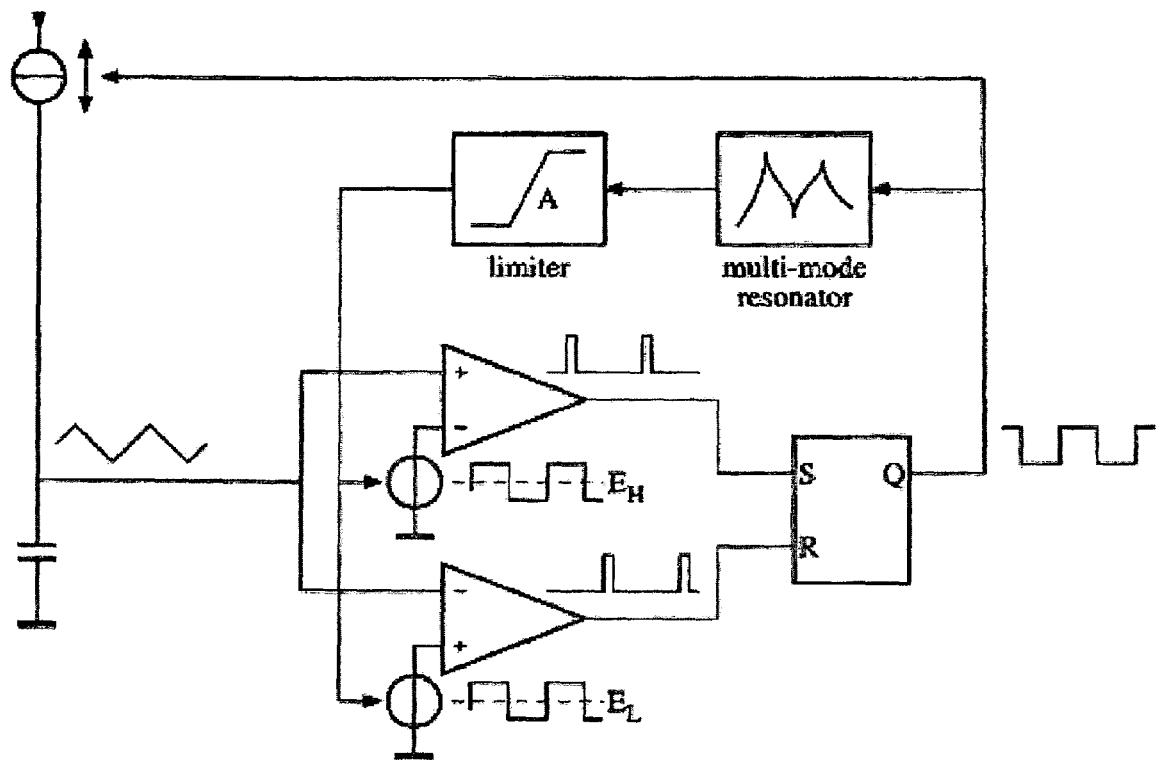
FIG. 4 illustrates a prior art resonator synchronized first order oscillator.
Figure 5:
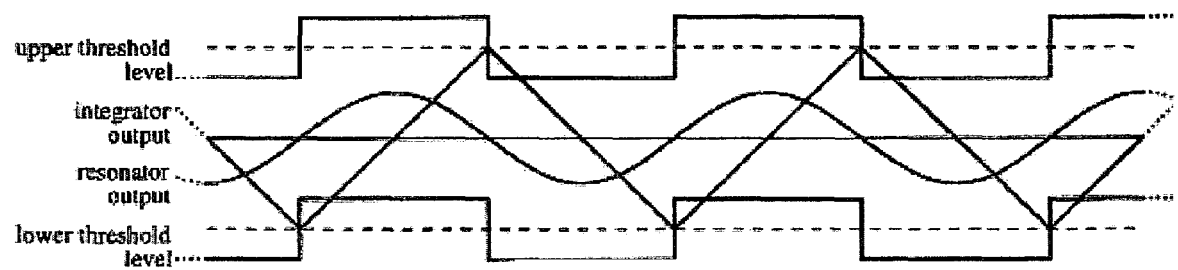
FIG. 5 illustrates the signals in a prior art resonator-synchronized first order oscillator.
Figure 6:
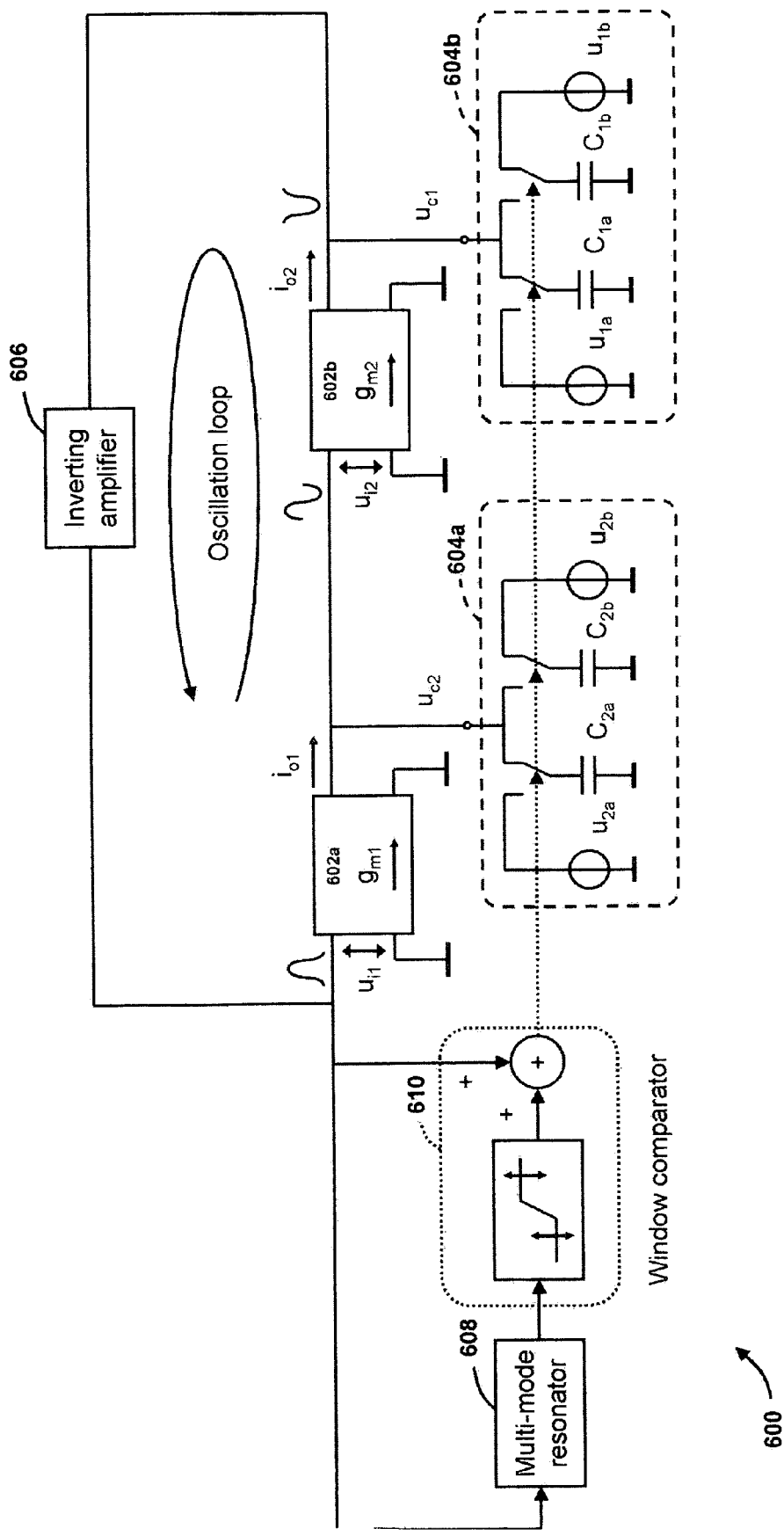
FIG. 6 illustrates a simplified schematic of a resonator-synchronized second order oscillator in accordance with one embodiment of the present invention.

Referring now to FIG. 6, there is shown a simplified schematic of a resonance-mode selection circuit 600 in accordance with one embodiment of the present invention. The resonance-mode selection circuit 600 of the present invention comprises a first and second transconductance amplifier, 602a and 602b, and a first and second capacitor switching circuit, 604a and 604b, coupled to an output of the first and second transconductance amplifiers, 602a and 602b. The circuit 600 further comprises an inverting amplifier 606, a multi-mode resonator 608, and a window comparator 610. Although this embodiment of the present invention comprises two capacitor switching circuits, 604a and 604b, one skilled in the pertinent art will realize that the present invention is not limited to this configuration and that in some applications, only one capacitor switching circuit can be used The capacitor switching circuits, 604a and 604b, each comprise a first capacitor (C2a and C1a) coupled to a first reference source (U2a and U1a) and a second capacitor (C2b and C1b) coupled to a second reference source (U1b and U2b). The reference sources, U, can be a DC source or they can also be a signal reference source, like a square wave source.

One skilled in the art will realize that the present invention is not limited to two reference sources, but that the present invention may also be used with only one reference source or that the reference sources may be combined. For example, when both reference sources are DC sources having the same value, only one source may be required. Alternatively, when two DC sources are required, it may be replaced by one, for example, square wave modulated source.

The capacitor switching circuits, 604a and 604b, switch between the two capacitors, C2a and C2b, or C1a and C1b, on the command of the multi-mode resonator 608 and the window comparator 610. When capacitor a (C2a or C1a) is switched to the output of the circuit and takes part in the oscillation, capacitor b (C2b or C1b) is switched to the output of the reference source (U2b or U1b), and charges capacitor b to a predefined voltage.

In this embodiment, it is assumed that two capacitors are used for 604a and two capacitors are used for 604b, but one skilled in the pertinent art will appreciate that different numbers and different combinations of numbers can be used depending on the application. Thus, the capacitor switching circuit 604 of the present invention can be advantageously used to control the amplitude, frequency and phase of the oscillation.

When the multi-mode resonator 608 is not present, switched capacitor circuits 604a and 604b are directly operated by a signal derived from the oscillator itself. In this case, capacitors C2a/C2b and C1a/C1b, charged to predefined values, are switched in and out of the circuit at the command of a signal derived from the oscillator itself to provide the signal amplitude and sustain oscillation as described in copending patent application Ser. No. 11/350755; filed Feb. 10, 2006 entitled "Quadrature Oscillator with Simplified Amplitude, Phase and Frequency Control" by Jan Roelof Westra.

Figure 7:
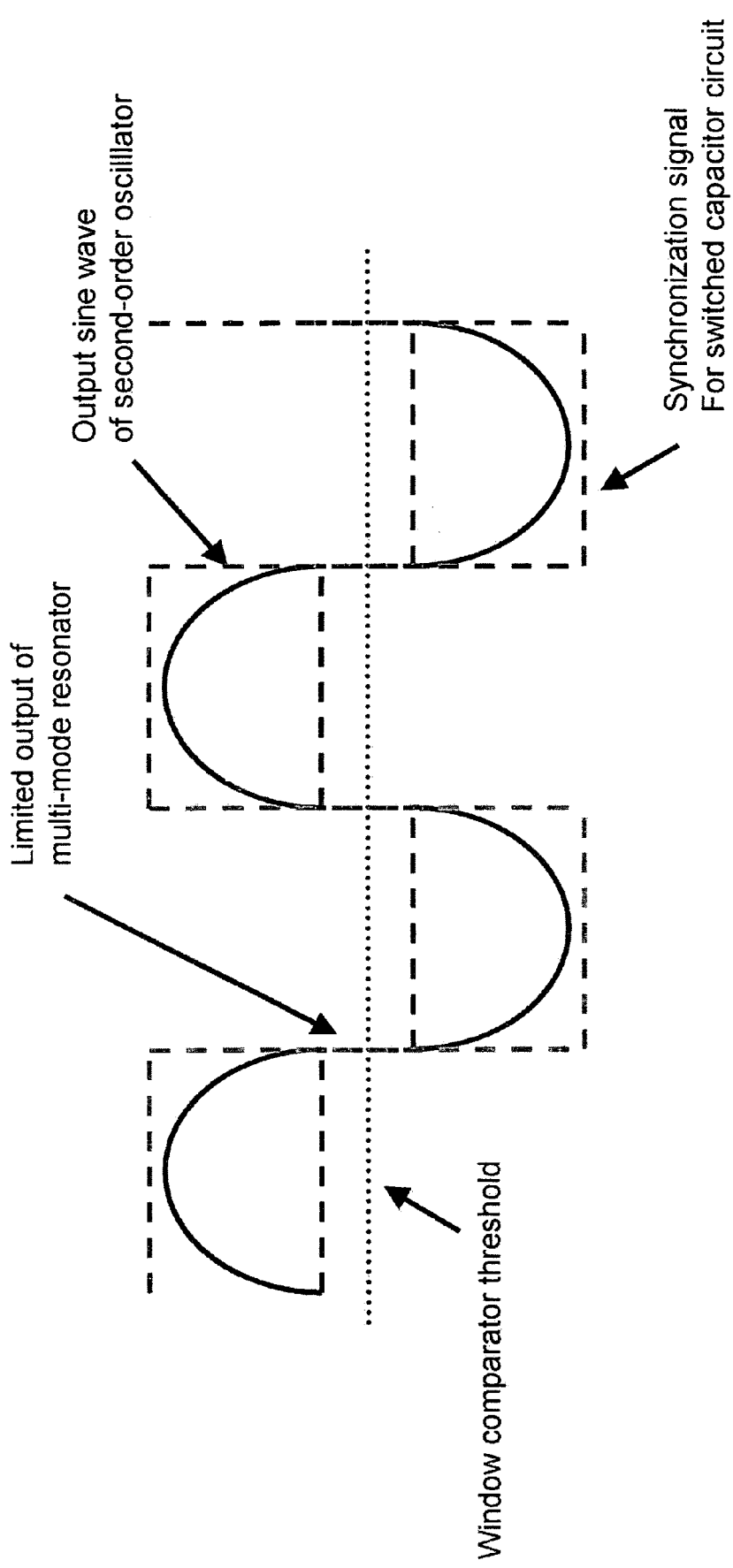
FIG. 7 illustrates the signals in a resonator-synchronized second order oscillator in accordance with one embodiment of the present invention.

When the multi-mode resonator 608 is added to the system, and the output is added to the sine-wave, the actual signal synchronizing the oscillator is the output of the multi-mode resonator, as can be seen in FIG. 7. The output of the multi-mode resonator can then synchronize the oscillator when the output frequency of the resonator is very close to the oscillation frequency of the second-order oscillator. If the output frequency of the resonator is not very close to the oscillation frequency of the second-order oscillator, the output of the multi-mode resonator will try to synchronize the oscillator, but will not succeed because the square wave added to the sine wave will not generate a zero-crossing of the synchronizing signal.

When the square wave synchronization signal does not result in a synchronization event in the oscillator, the oscillator will keep injecting energy close to the free-running oscillation frequency of the second-order oscillator, thus forcing the multi-mode resonator in the desired mode of resonance.

Eventually, synchronization of the oscillations will occur and the synchronization will be completely dominated by the multi-mode resonator.

Figure 8:
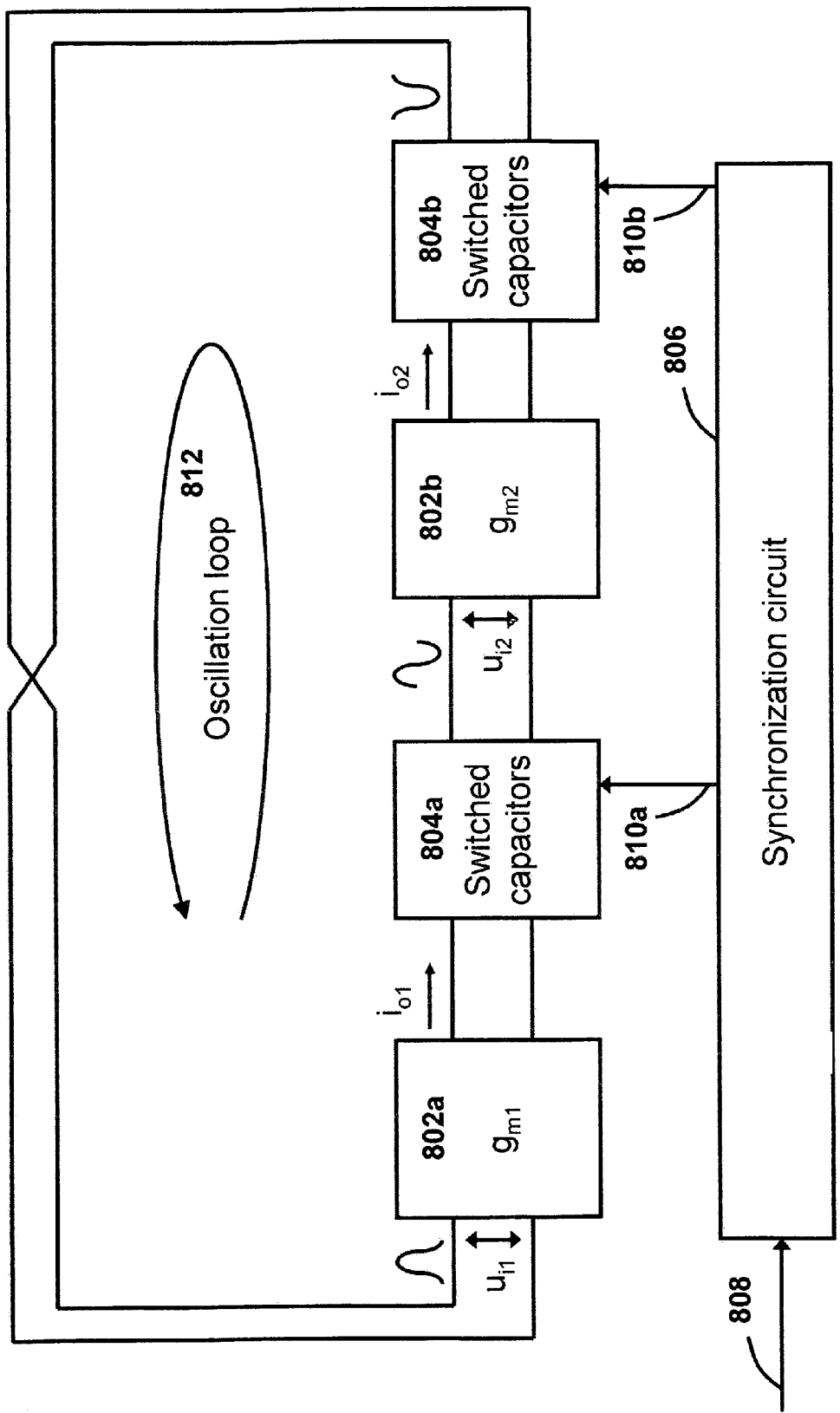
FIG. 8 is schematic of a second order oscillator in accordance with one embodiment of the present invention.

Referring now to FIG. 8, there is shown a schematic view of a resonator-synchronized second order oscillator 800 in accordance with another embodiment of the present invention. The differential oscillator architecture comprises a first and second differential transconductance amplifier 802a and 802b, and a first and second capacitor switching circuit 804a and 804b. The oscillator further comprises a synchronization circuit 806 and a synchronization signal 808. On command of the synchronization signal 808, a first and second synchronization signal 810a and 810b are generated by synchronization circuit 806.

Figure 9:
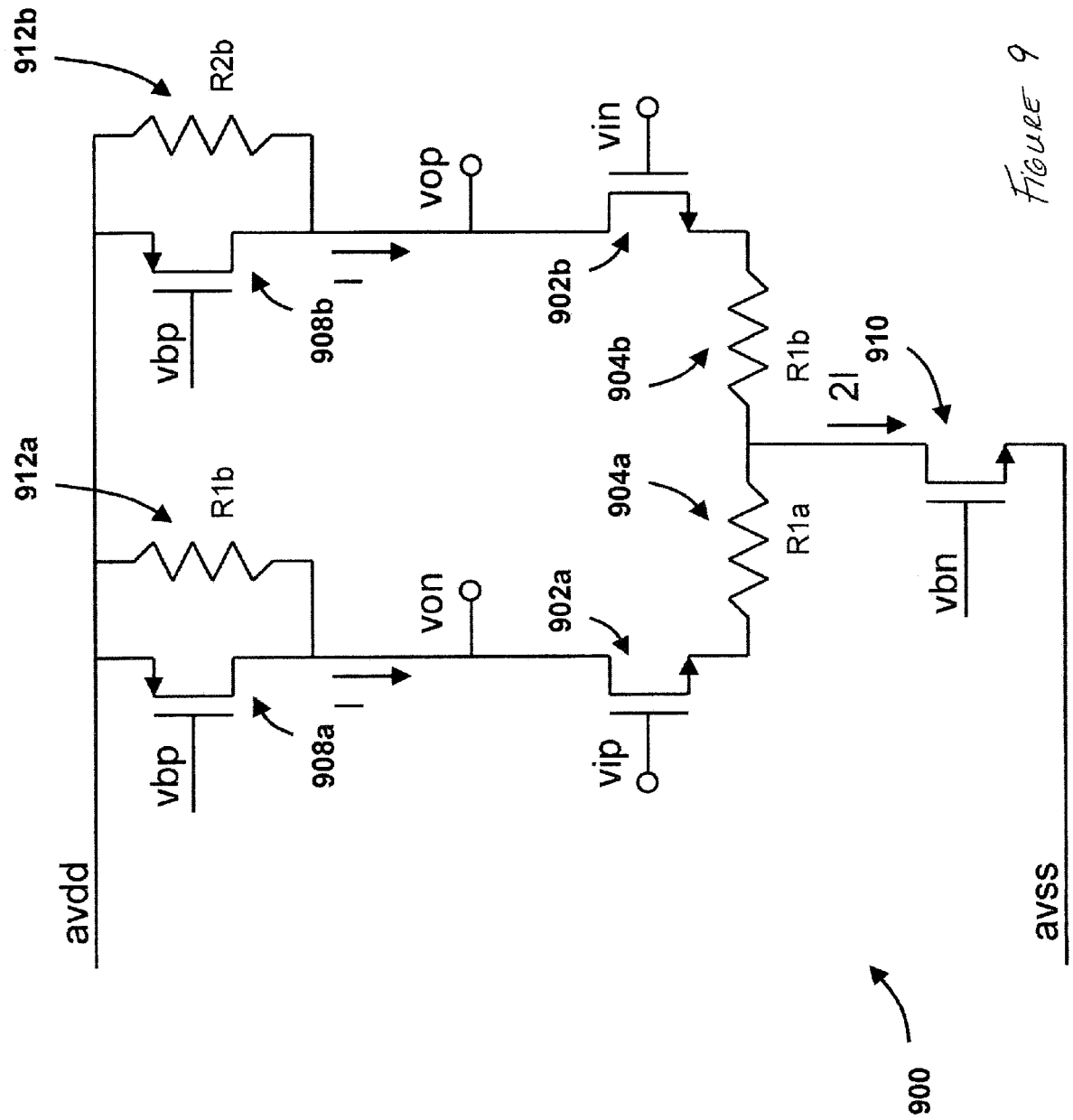
FIG. 9 is a schematic of a transconductance amplifier in a second order oscillator in accordance with one embodiment of the present invention.

Referring now to FIG. 9, there is shown a schematic view of a transconductance amplifier 900 in the second order oscillator in accordance with one embodiment of the present invention. The well known differential transconductance amplifier comprises first and second input transistors 902a and 902b and first and second degeneration resistors 904a and 904b. Further, it comprises first and second bias transistors 908a and 908b and a tail bias transistor 910. The amplifier 900 can also comprise first and second bias resistors 912a and 912b. Input signals vip/vin are buffered using the input transistor pair 902, and transferred into an output current using degeneration resistor pair 904. The resulting generated output current flows through the load of the circuit, connected to output terminals von/vop. One skilled in the art will realize that the present invention is not limited to this embodiment of a transconductance amplifier but that other circuit designs may be used as well.

Figure 10:
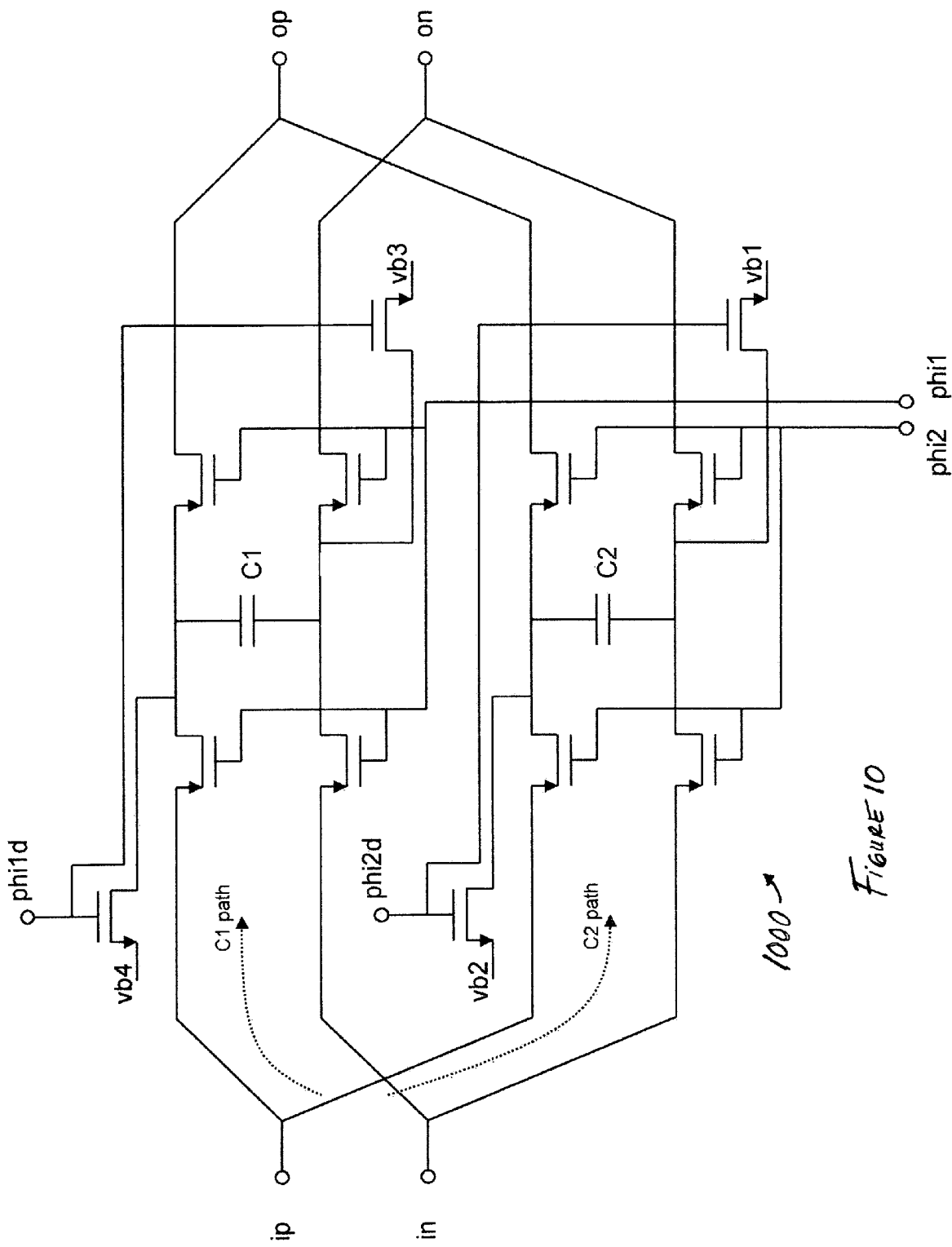
FIG. 10 is a schematic of a switched capacitor structure in accordance with one embodiment of the present invention.

Referring now to FIG. 10, there is shown a schematic view of a switched capacitor structure 1000 in accordance with one embodiment of the present invention. In this structure 1000, one of two capacitors (C1 or C2) can be switched into the circuit while the other capacitor (C2 or C1) is switched out of the oscillation loop to be precharged to a predetermined voltage. For example, when the C1 path is used in the oscillation loop, C2 is charged to a voltage vb2-vb1. Similarly, when the C2 path is used in the oscillation loop, C1 is charged to a voltage vb4-vb3. One skilled in the art will realize that the present invention is not limited to this embodiment of a switched capacitor but that other circuit designs may be used as well.

Figure 11:
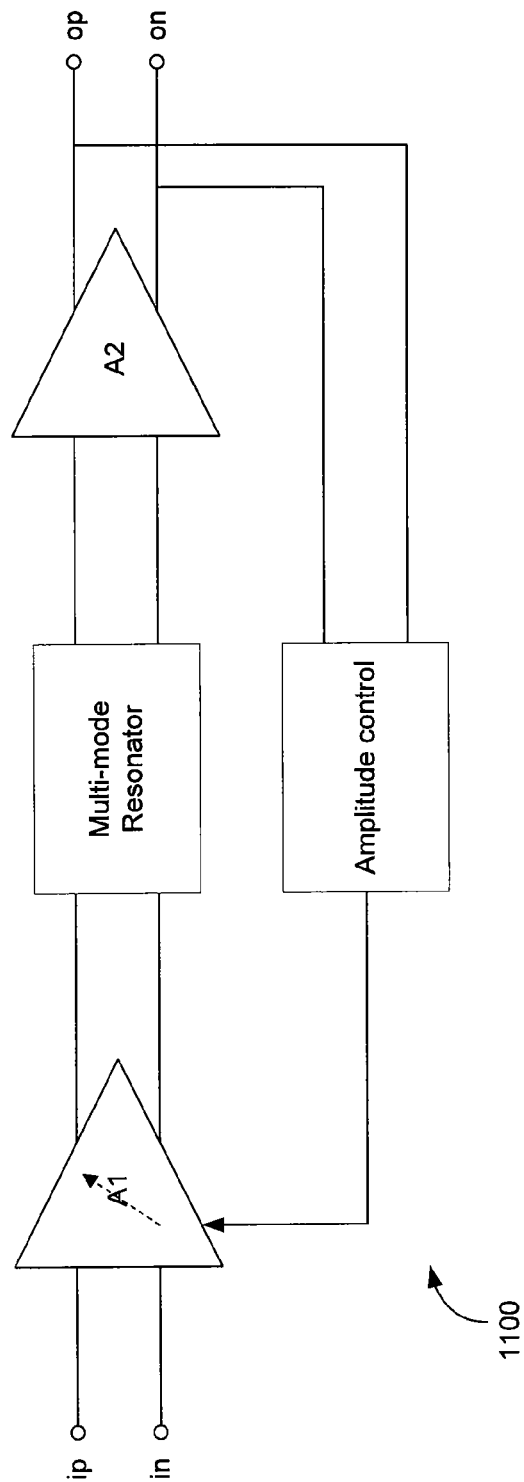
FIG. 11 is a schematic of a crystal driver with amplitude control in accordance with one embodiment of the present invention.

Referring now to FIG. 11, there is shown a schematic view of a crystal driver with amplitude control 1100 in accordance with one embodiment of the present invention. In this embodiment, a crystal driver may be added to the multi-mode resonator 608 of the present invention. Adding the crystal driver to the multi-mode resonator enables accurate control of the signal driving the crystal, such that it is optimally designed to suit the resonator's driving requirements. Moreover, the gain of this driver can be controlled using an amplitude control loop. Adding a crystal driver to the present invention advantageously enables the designer of the circuit to maximize the power in the resonator to optimize the oscillator's noise behavior.

Figure 12:
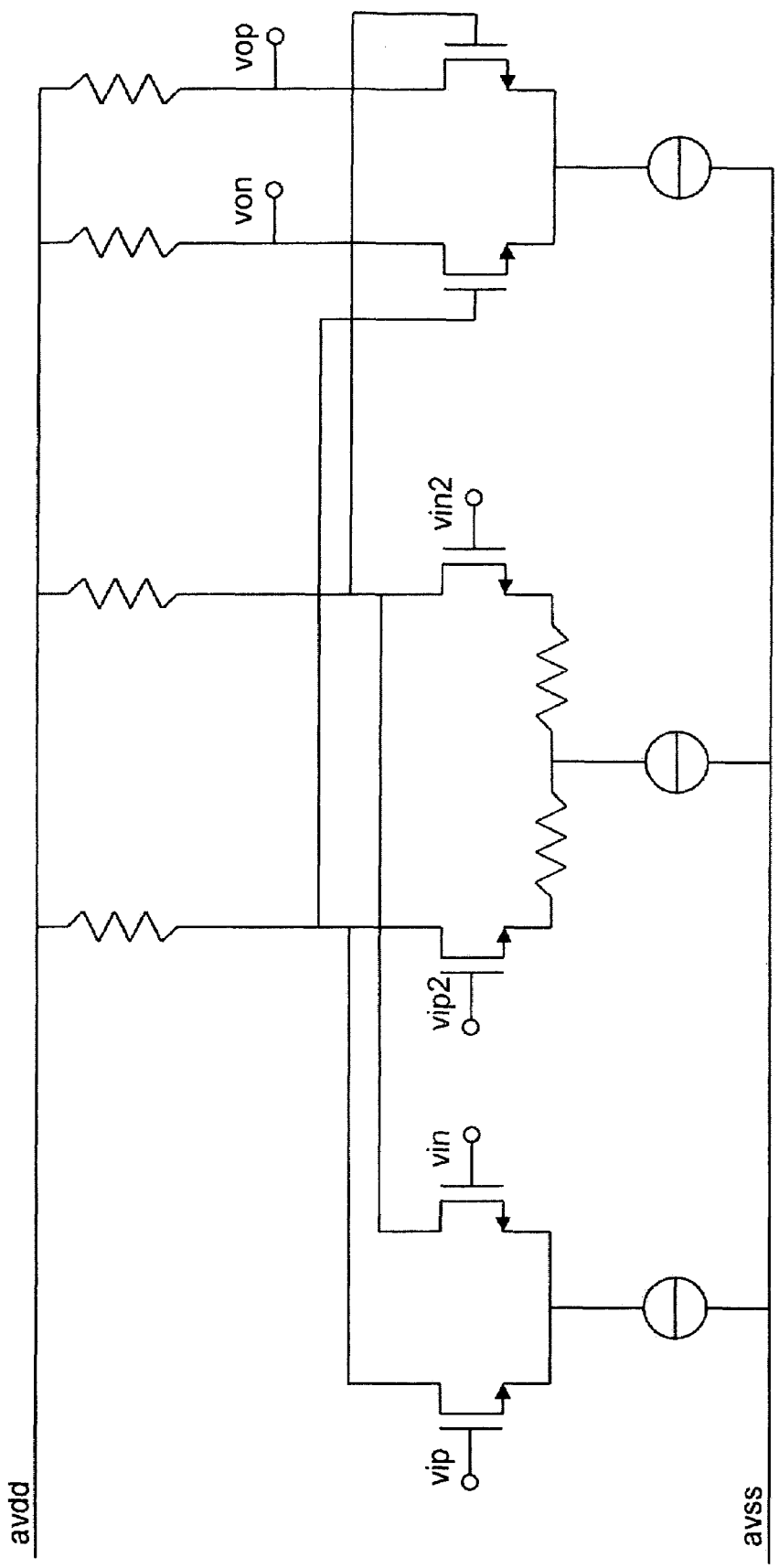
FIG. 12 is a schematic of a window comparator in accordance with one embodiment of the present invention.

Referring now to FIG. 12, there is shown a schematic view of a window comparator in accordance with one embodiment of the present invention. An output sine wave voltage of the second-order oscillator is connected to the vip2/vin2 inputs of the window comparator and more or less linearly converted to an output current of the differential pair. The output of the multi-mode resonator is connected to the vip/vin inputs of the window comparator. This will switch the differential pair and add a more or less square wave current to the sine wave, as depicted in FIG. 7. One skilled in the art will realized that the present invention is not limited to this example of a window comparator but that other circuit designs may be used equally well.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A resonator synchronized oscillator, comprising:
   an oscillation loop including at least one transconductance amplifier;
   a capacitor switching circuit having a reference source, coupled to the oscillation loop in a manner that allows it to reset a phase of an oscillation generated by the oscillation loop; and
   a multi-mode resonator coupled to the oscillation loop and constructed and arranged to control either directly or indirectly switching of the capacitor switching circuit.

2. The oscillator according to claim 1 wherein the multi-mode resonator comprises a crystal and a crystal driver constructed and arranged to control the crystal.

3. A resonator synchronized oscillator, comprising:
   an oscillation loop including two transconductance amplifiers;
   two capacitor switching circuits, coupled to the oscillation loop in a manner that allows it to reset a phase of an oscillation generated by the oscillation loop; and
   a multi-mode resonator coupled to the oscillation loop and configured to control either directly or indirectly switching of at least one capacitor switching circuit;
   wherein each transconductance amplifier is coupled to at least one capacitor switching circuit.

4. A resonator synchronized oscillator, comprising:
   an oscillation loop including a transconductance amplifier;
   a capacitor switching circuit, coupled to the oscillation loop in a manner that allows it to reset a phase of an oscillation generated by the oscillation loop;
   a multi-mode resonator coupled to the oscillation loop and configured to control either directly or indirectly switching of the capacitor switching circuit; and
   a window comparator, coupled between the multi-mode resonator and the capacitor switching circuit.

5. A resonator synchronized oscillator, comprising:
   an oscillation loop including a transconductance amplifier;
   a capacitor switching circuit, coupled to the oscillation loop in a manner that allows it to reset a phase of an oscillation generated by the oscillation loop; and
   a multi-mode resonator coupled to the oscillation loop and configured to control either directly or indirectly switching of the capacitor switching circuit;
   wherein the capacitor switching circuit comprises:
      a first capacitor;
      a first reference source;
      a second capacitor; and
      a switch, controlled directly or indirectly by the multi-mode resonator, constructed and arranged to selectively connect the first and second capacitors to either the reference source or to the oscillation loop.

6. The oscillator according to claim 5 further comprising a second reference source, the first and second reference sources and the switch being arranged such that the first capacitor can be selectively coupled to either the first reference source or the oscillation loop and the second capacitor can be selectively coupled to either the second reference source or the oscillation loop.

7. The oscillator according to claim 5 wherein the first reference source is a signal reference source.

8. A resonator-synchronized oscillator circuit comprising:
an oscillation loop including a first and a second transconductance amplifier;
a first capacitor switching circuit coupled to an output of the first transconductance amplifier and constructed and arranged to reset a phase of an oscillation generated by the oscillation loop; and
a multi-mode resonator coupled to the oscillation loop and constructed and arranged to control switching of the first capacitor switching circuit.

9. The oscillator circuit of claim 8 further comprising:
a second capacitor switching circuit, the second capacitor switching circuit coupled to an output of the second transconductance amplifier.

10. The oscillator circuit of claim 9 wherein the second capacitor switching circuit comprises:
a third capacitor;
a second reference source;
a fourth capacitor; and
a switch, controlled directly or indirectly by the multi-mode resonator, constructed and arranged to selectively connect the third and fourth capacitors to either the second reference source or to the oscillation loop.

11. The oscillator circuit of claim 8 further comprising:
a window comparator having an output coupled to the first capacitor switching circuit and an input coupled to the multi-mode resonator.

12. The oscillator circuit of claim 11 wherein the multi-mode resonator further comprises a crystal and a crystal driver constructed and arranged to control the crystal.

13. The oscillator circuit of claim 8 wherein the multi-mode resonator comprises a crystal and a crystal driver for controlling the crystal.

14. The oscillator circuit of claim 8 wherein the first capacitor switching circuit comprises:
a first capacitor;
a first reference source; and
a second capacitor; and
a switch, controlled directly or indirectly by the multi-mode resonator, constructed and arranged to selectively connect the first and second capacitors to either the reference source or to the oscillation loop.

15. The oscillator circuit of claim 14 further comprising a second reference source, the first and second reference sources and the switch being arranged such that the first capacitor can be selectively coupled to either the first reference source or the oscillation loop and the second capacitor can be selectively coupled to either the second reference source or the oscillation loop.

16. The oscillator circuit of claim 14 wherein the first reference source is a signal reference source.

17. A differential oscillator circuit comprising:
an oscillation loop including a first and a second differential transconductance amplifier;
a first capacitor switching circuit coupled to an output of the first differential transconductance amplifier and constructed and arranged to reset a phase of an oscillation generated by the oscillation loop; and
a synchronization circuit constructed and arranged to control switching of the first capacitor switching circuit based on an external synchronization signal.

18. The oscillator circuit of claim 17 further comprising:
a second capacitor switching circuit coupled to an output of the second differential transconductance amplifier, the synchronization circuit also being constructed and arranged to control the switching of the second capacitor switching circuit.

19. The oscillator circuit of claim 18 wherein the second capacitor switching circuit comprises:
a third capacitor;
a second reference source;
a fourth capacitor; and
a switch, controlled directly or indirectly by the multi-mode resonator, constructed and arranged to selectively connect the third and fourth capacitors to either the second reference source or to the oscillation loop.

20. The oscillator circuit of claim 17 wherein the first capacitor switching circuit comprises:
a first capacitor;
a first reference source
a second capacitor; and
a switch, controlled directly or indirectly by the synchronization circuit, constructed and arranged to selectively connect the first and second capacitors to either the reference source or to the oscillation loop.

21. The oscillator circuit of claim 20 further comprising a second reference source, the first and second reference sources and the switch being arranged such that the first capacitor can be selectively coupled to either the first reference source or the oscillation loop and the second capacitor can be selectively coupled to either the second reference source or the oscillation loop.

22. The oscillator circuit of claim 20 wherein the first reference source is a signal reference source.

* * * * *